(12) United States Patent
Yu et al.

(10) Patent No.: US 8,477,531 B2
(45) Date of Patent: Jul. 2, 2013

(54) SPIN TORQUE TRANSFER MAGNETORESISTIVE RANDOM ACCESS MEMORY IN DISK BASE WITH REDUCED THRESHOLD CURRENT

(75) Inventors: Chwen Yu, Taipei (TW); Tien-Wei Chiang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 156 days.

(21) Appl. No.: 12/969,163

(22) Filed: Dec. 15, 2010

(65) Prior Publication Data

US 2012/0153411 A1    Jun. 21, 2012

(51) Int. Cl.
*H01L 29/82* (2006.01)

(52) U.S. Cl.
USPC ............... 365/173; 257/421; 257/E29.323; 257/E43.004; 257/E21.665; 365/171; 438/3

(58) Field of Classification Search
USPC .......... 257/421, E29.323, E43.004, E21.665; 365/171, 173; 438/3
See application file for complete search history.

(56) References Cited

U.S. PATENT DOCUMENTS

| | | | | |
|---|---|---|---|---|
| 6,518,588 B1 * | 2/2003 | Parkin et al. | ...................... | 257/3 |
| 6,677,631 B1 * | 1/2004 | Drewes | .......................... | 257/295 |
| 7,528,457 B2 * | 5/2009 | Horng et al. | .................. | 257/421 |
| 2001/0026471 A1 * | 10/2001 | Michijima et al. | ............ | 365/173 |
| 2004/0217399 A1 * | 11/2004 | Drewes | .......................... | 257/295 |
| 2005/0205908 A1 * | 9/2005 | Fukuzumi | ...................... | 257/295 |
| 2007/0243638 A1 * | 10/2007 | Horng et al. | ...................... | 438/3 |

OTHER PUBLICATIONS

Randall Law et al., "Reduction in critical current for spin transfer switching in perpendicular anisotropy spin valves using an in-plane spin polarizer", Applied Physics Letters 94, 062516 (2009), 3 pages, Feb. 13, 2009.

Laqiao Liu et al., "Reduction of the spin-torque critical current by partially canceling the free layer demagnetization field", Applied Physics Letters 94, 122508 (2009), 3 pages, Mar. 26, 2009.

V.L. Mironov et al., "Magnetic force microscope tip-induced remagnetization of CoPt nanodisks with perpendicular anisotropy", Journal of Applied Physics 106, 053911 (2009), 8 pages, Sep. 14, 2009.

A.D. Kent et al., "Spin-transfer-induced precessional magnetization reversal" Applied Physics Letters, vol. 84, No. 19, May 10, 2004, 3 pages.

A.A. Tulapurkar et al., Subnanosecond magnetization reversal in magnetic nanopillars by spin angular momentum transfer, Applied Physics Letters vol. 85, No. 22, Nov. 29, 2004, p. 5358-5360.

Y. Jiang et al., "Spin transfer in antisymmetric exchange-biased spin-valves", Applied Physics Letters 86, 192515 (2005), 3 pages, May 6, 2005.

E.B. Myers et al., "Current-Induced Switching of Domains in Magnetic Multilayer Devices", www.sciencemag.org, Science vol. 285, Aug. 6, 1999, pp. 867-870.

* cited by examiner

*Primary Examiner* — Allan R Wilson
(74) *Attorney, Agent, or Firm* — Haynes and Boone, LLP

(57) ABSTRACT

A semiconductor memory device includes a magnetic tunneling junction (MTJ); and a magnetic feature aligned with the MTJ and approximate the MTJ. When viewed in a direction perpendicular to the MTJ and the magnetic feature, the magnetic feature has a disk shape, and the MTJ has an elliptical shape and is positioned within the disk shape.

20 Claims, 15 Drawing Sheets

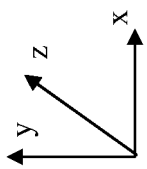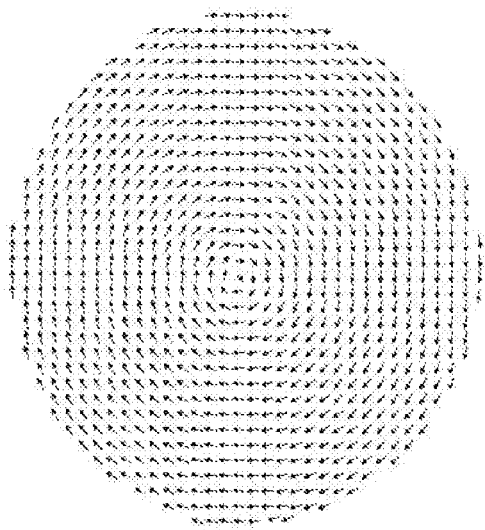
Fig. 3

SPIN TORQUE TRANSFER MAGNETORESISTIVE RANDOM ACCESS MEMORY IN DISK BASE WITH REDUCED THRESHOLD CURRENT

BACKGROUND

In semiconductor integrated circuit (IC) devices, magnetic random access memory (MRAM) is an emerging technology for next generation embedded memory devices. When writing to a MRAM cell, electrical currents in the writing lines are used to generate a magnetic field to reorient the electron spins in a magnetic layer of the MRAM. However, the writing currents are too large and present various issues including a half selection issue. Currently, a spin-polarized electrical current is used to reorient electron spins of the magnetic material layer in the MRAM by a mechanism referred to as spin torque transfer (STT). The writing current in the spin torque transfer is substantially less than the writing currents reduced, but the writing current is still expected to be reduced. As semiconductor IC technology is continually progressing to circuit layouts having smaller feature sizes as well as increased density, a large writing current will limit the scaling of the transistor and will lead to a large cell size. As a result of this continuous progression, the reduction of the writing current is a challenging issue. Some existing approaches may be able to reduce the writing current but will also cause other problems and side effects. For example, reducing a thickness of the corresponding magnetic layer may reduce the writing current but can present manufacturing control and repeatability issues. Using a magnetic material such as iron platinum alloy (FePt) may reduce the writing current but the material cost is high. In various other examples, negative issues include unexpected tunnel magnetoresistance (TMR) reduction and thermal stability degradation of the MRAM device. Accordingly, it is desirable to provide an improved MRAM structure and method of manufacturing the same that is absent of the disadvantages discussed above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 3 illustrates orientations of electron spins in a magnetic feature of the semiconductor memory device of FIG. 1 constructed according to various aspects of the present disclosure.

DETAILED DESCRIPTION

Figure 1:
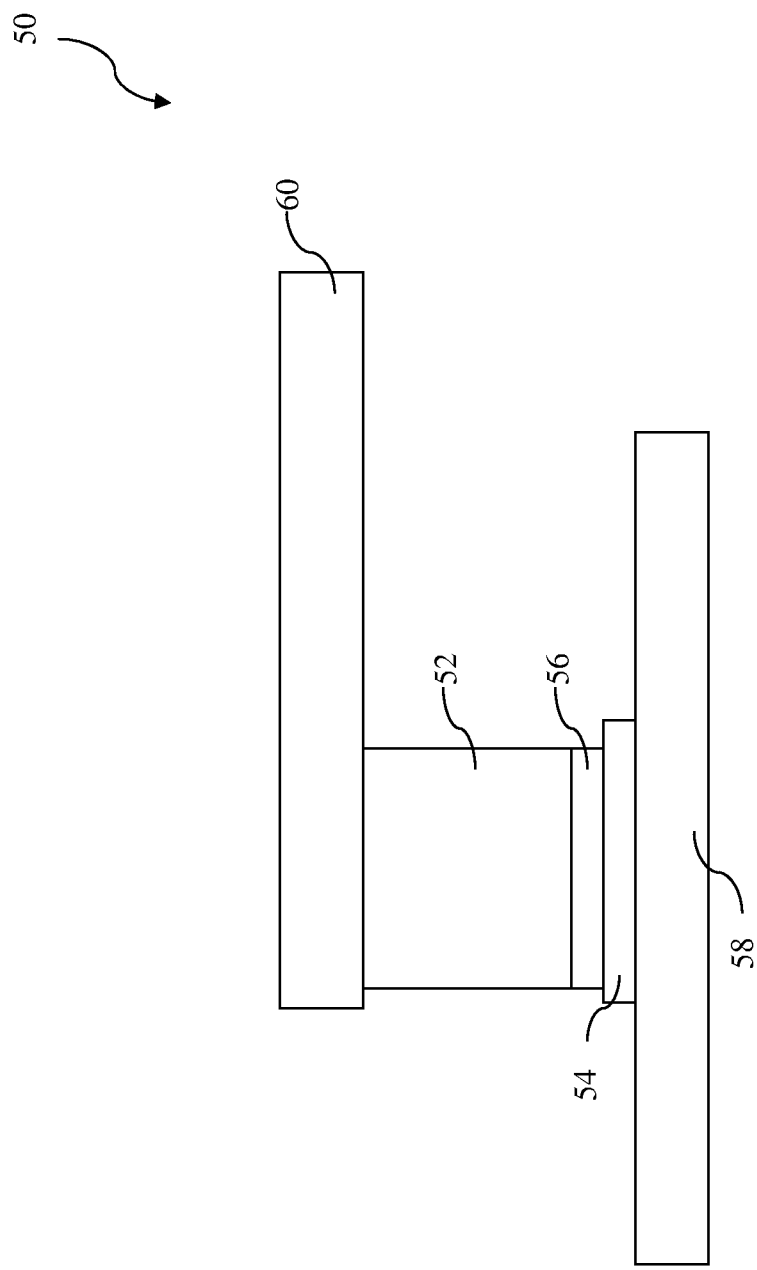
FIG. 1 is a sectional view illustrating an embodiment of a semiconductor memory device constructed according to aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a sectional view illustrating an embodiment of a semiconductor memory device 50 constructed according to aspects of the present disclosure. With reference to FIG. 1, the semiconductor memory device 50 and a method of making the same are collectively described. The semiconductor memory device 50 is a portion of a magnetic random access memory (MRAM) cell designed with a writing mechanism of spin torque transfer (STT), therefore, the MRAM 50 is also referred to as STT-MRAM.

The semiconductor memory device 50 includes a magnetic tunnel junction (MTJ) 52 configured according to various aspects of the present disclosure in different embodiments. The MTJ 52 includes a free magnetic metal layer and a fixed magnetic metal layer separated by a thin dielectric spacer designed to achieve magnetic tunneling effect.

The free magnetic layer of the MTJ 52 includes a ferromagnetic material. The ferromagnetic material can form permanent magnets and/or exhibit strong interactions with magnets. In one embodiment, the ferromagnetic material includes a cobalt-iron-boron (CoFeB) film. In another embodiment, the ferromagnetic material may additionally include other materials, such as Ta, Ru, or NiFe. In yet another embodiment, the ferromagnetic material may alternatively include other materials, such as CoFeTa, NiFe, Co, CoFe, CoPt, CoPd, or alloy of Ni, Co, and Fe. The free magnetic layer may have a thickness less than about 30 angstroms. In one example, the free magnetic layer is formed by physical vapor deposition (PVD), or alternatively another suitable process. electron spins of the free magnetic layer can be reoriented by a polarized current during a writing operation of the MRAM cell.

The fixed magnetic layer of the MTJ 52 is also referred to as a pinned magnetic layer. The fixed magnetic layer is adjacent the thin dielectric spacer and includes a ferromagnetic material similar to the ferromagnetic material of the free magnetic layer. For example, the ferromagnetic material of the fixed magnetic layer includes a cobalt-iron-boron (CoFeB) film. In other examples, the ferromagnetic material may additionally include other materials, such as Ta, Ru, or NiFe. In yet other examples, the ferromagnetic material may alternatively include other materials, such as CoFeTa, NiFe, Co, CoFe, CoPt, CoPd, or the alloy of Ni, Co, and Fe. The fixed magnetic layer may have a thickness ranging between about 15 angstroms and about 40 angstroms. In one example, the fixed magnetic layer is formed by PVD, or alternatively another suitable process. Electron spins of the fixed magnetic layer are pinned during a writing operation of the MRAM cell. In one embodiment, the fixed magnetic layer is pinned by a pinning layer including an anti-ferromagnetic material disposed adjacent the ferromagnetic material of the fixed magnetic layer, such that the electron spins of the corresponding ferromagnetic material are pinned by the anti-ferromagnetic material. In the anti-ferromagnetic material, magnetic moments of atoms or molecules align in a regular pattern with neighboring spins pointing in opposite directions. In one example, the anti-ferromagnetic material includes platinum manganese (PtMn). In another example, the anti-ferromagnetic material includes iridium manganese (IrMn). The pinning layer may have a thickness ranging between about 100 angstroms and about 200 angstroms. In an embodiment, the fixed magnetic layer is thicker than the free magnetic layer, such that the fixed magnetic layer is pinned during a writing operation of the MRAM cell. In this case, the ferromagnetic material of the fixed magnetic layer is thick enough to achieve the pinning effect.

The thin dielectric spacer of the MTJ is also referred to as a barrier layer and is disposed between the free magnetic layer and the fixed magnetic layer. In the embodiment where the pinning layer is used to pin the electron spins of the fixed magnetic layer, the fixed magnetic layer of the ferromagnetic material is disposed between the thin dielectric spacer and the pinning layer of the anti-ferromagnetic material. The thin dielectric spacer includes a very thin dielectric material layer and is configured between the free magnetic layer and the fixed magnetic layer for tunneling effect. In one embodiment, the thin dielectric spacer includes magnesium oxide (MgO). Alternatively, the thin dielectric spacer may include aluminum oxide (AlO), aluminum nitride (AlN), aluminum oxynitride (AlON), or other suitable non-magnetic material. The thin dielectric spacer is thin enough such that electrons can tunnel through the thin dielectric spacer when a bias voltage is applied. In one embodiment, the thin dielectric spacer has a thickness ranging between about 5 angstroms and about 15 angstroms. In another embodiment, the thin dielectric spacer may be formed by a PVD process. For example, a magnesium target is used in a sputtering chamber with an oxygen gas to form magnesium oxide. Alternatively, a magnesium film is first formed by sputtering and then converted into the MgO film by applying an oxygen plasma.

The semiconductor memory device 50 further includes a magnetic feature 54 configured approximate the MTJ 52. In one embodiment, the magnetic feature 54 includes a ferromagnetic material similar to the ferromagnetic material of the free magnetic layer or the fixed magnetic layer of the MTJ 52. For example, the ferromagnetic material of the magnetic feature 54 includes a cobalt-iron-boron (CoFeB) film. In other examples, the ferromagnetic material may additionally include other materials, such as Ta, Ru, or NiFe. In yet other examples, the ferromagnetic material may alternatively include other materials, such as CoFeTa, NiFe, Co, CoFe, CoPt, CoPd, or the alloy of Ni, Co, and Fe.

Figure 2:
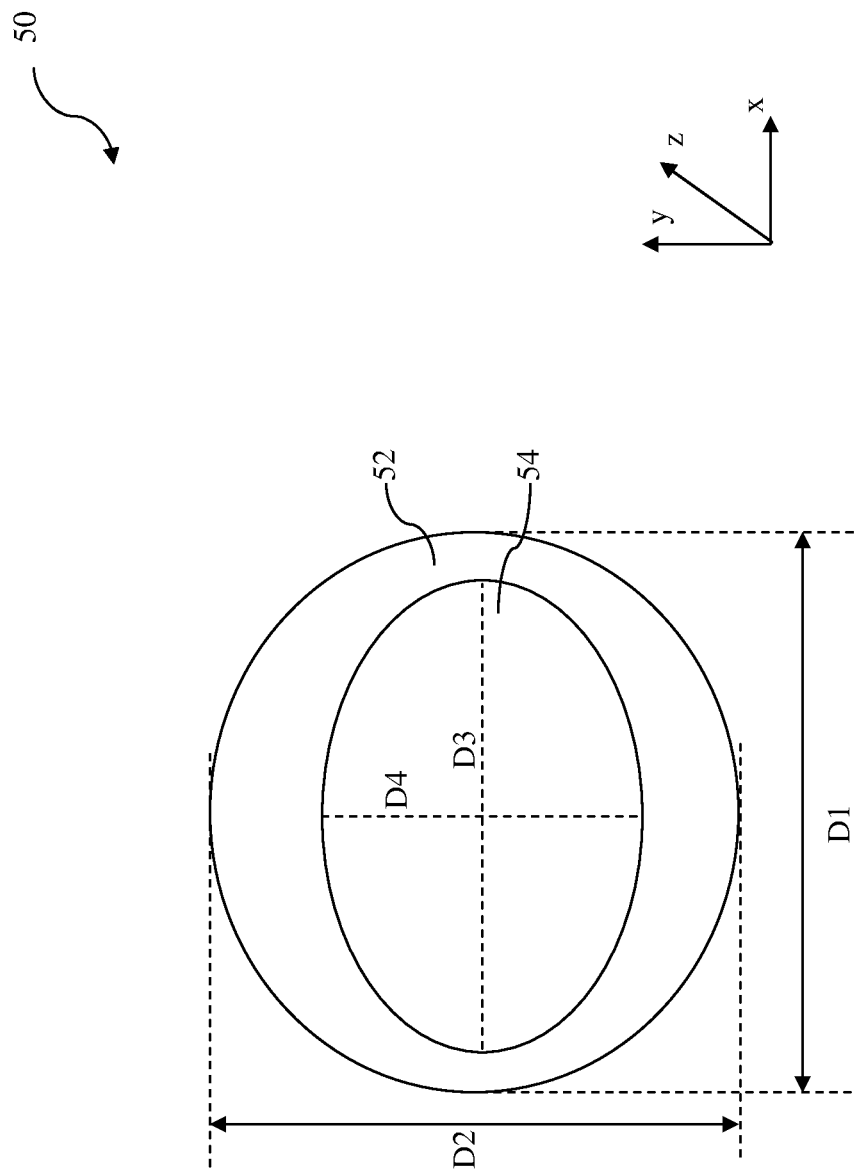
FIG. 2 is a top view of the semiconductor memory device of FIG. 1 in one embodiment.

The magnetic feature 54 is designed to have a disk shape (or round shape) when viewed in a direction perpendicular to the MTJ 52 (free magnetic layer, thin dielectric spacer, and the fixed magnetic layer) as illustrated in FIG. 2. FIG. 2 is a top view of the semiconductor memory device 50 in one embodiment. The vertical direction is labeled as the z direction, and the other two horizontal directions, x and y, are perpendicular to each other. Particularly, in the top view, the magnetic feature 54 defines a first dimension D1 in a first direction (x direction) and a second dimension D2 in a second direction (y direction) perpendicular to the first direction. The parameters D1 and D2 define a ratio D1/D2 substantially equal to 1. In one embodiment, the ratio D1/D2 of the magnetic feature 54 ranges from about 0.9 to about 1.1. Preferably, the ratio is equal to 1 or D1 is equal to D2, referred to as D. In one embodiment, the parameter D is about 90 nanometer.

In contrast, the MTJ 52 is designed to have an asymmetric shape in the top view as illustrated in FIG. 2. Particularly, the MTJ 52 in the top view defines an elliptical shape having a third dimension D3 in the first direction (x direction) and a fourth dimension D4 in the second direction (y direction). D3 is substantially greater than D4. Further, the parameters D3 and D4 define a ratio D3/D4 substantially greater than 1. In one embodiment, the ratio D3/D4 of the MTJ 52 is greater than or equal to about 1.5. Still referring to FIG. 2, in the top view, the MTJ 52 is disposed within the magnetic feature 54. Particularly, D3 is less than or equal to D. In one example, D3 is less than or equal to about 90 nanometers. When D3 is equal to D, the farthest edges of the MTJ 52 are substantially aligned with the farthest edges of the magnetic feature 54 in the x direction.

When writing to the MTJ 52, the writing current is at least equal to a minimum electrical current (referred to as threshold current) to reorient electron spins of the free magnetic layer of the MTJ 52. The magnetic feature 54 as a disk base serves to magnetically couple with the MTJ 52 and reduce the threshold current. In one embodiment, the magnetic feature 54 has a thickness greater than the thickness of the free magnetic layer of the MTJ 52. In one embodiment, the magnetic feature 54 has a thickness less than about 30 nanometers.

As the magnetic feature 54 of the ferromagnetic material is in the disk geometry, in the x-y plane parallel to the magnetic feature 54, electron spins in the magnetic feature 54 will align along a tangent direction around the center of the disk due to the geometric constraints, having a pattern as illustrated in FIG. 3 in the top view. Accordingly, the electron spins of the magnetic feature 54 are not completely in the x-y plane but also have a vertical component in the z-direction perpendicular to the x-y plane. In other words, the electron spins are tilted toward the vertical direction. The vertical component of the electron spins in the magnetic feature 54 increases toward the center of the disk. The electron spins of the magnetic feature 54 will couple with the free magnetic layer or the fixed magnetic layer of the MTJ 52. Thus, the vertical component of the electron spins of the magnetic feature 54 will impact the free magnetic layer (or fixed magnetic layer) of the MTJ 52, such that the electron spins of the free magnetic layer (or fixed magnetic layer) of the MTJ 52 have a vertical component. This reduces the spin torque to reorient the electron spins of the free magnetic layer (or fixed magnetic layer) of the MTJ 52. Accordingly, the threshold current is reduced.

In furtherance of the present embodiment, a conductive spacer (or conductive layer) 56 is interposed between the magnetic feature 54 and the MTJ 52. The conductive spacer 56 includes a conductive and nonmagnetic material. In one embodiment, the conductive feature 56 includes copper (Cu) or other suitable metal. The conductive spacer 56 can be formed by implementing a deposition process, such as PVD, plating or combination thereof. In the present embodiment, where that the magnetic feature 54 includes ferromagnetic material, the conductive spacer 56 is adjacent the free magnetic layer of the MTJ 52. Alternatively, the conductive spacer 56 is adjacent the fixed magnetic layer or the pinning layer if present. In one embodiment, the conductive spacer 56 is patterned to a disk shape the same as that of the magnetic feature 54. In another embodiment, the conductive spacer 56 is patterned to an elliptical shape the same as that of the MTJ 52. In another embodiment, the magnetic feature 54 includes an anti-ferromagnetic material. In this embodiment, there is not a conductive spacer disposed between the MTJ 52 and the magnetic feature 54, and the magnetic feature 54 is adjacent the fixed magnetic layer of the MTJ 52, serving as the pinning layer. Similarly, the electron spins of the magnetic feature 54 have a vertical component coupled to the fixed magnetic layer, causing the electron spins of the fixed magnetic layer to tilt toward the vertical direction. Accordingly, the threshold current is reduced as well.

After the deposition of the various material layers of the MTJ 52 and the magnetic feature 54, the MTJ 52 and the magnetic feature 54 can be patterned to have corresponding geometries using a suitable patterning technology. In one embodiment, a first patterning procedure is implemented to pattern both the MTJ 52 and the magnetic feature 54 into disk shapes. Then, a second patterning procedure is implemented to pattern the MTJ into an elliptical shape. Each patterning procedure includes a lithography process and an etching process. For example, a lithography process forms a patterned photoresist layer on the underlying material layers (MTJ 52 and the magnetic feature 54 in the first patterning procedure or the MTJ 52 in the second patterning procedure). Then, an etching process is applied to the underlying material layers using the patterned photoresist layer as an etch mask. Thereafter, the patterned photoresist layer is removed by wet stripping or plasma ashing. The lithography process may include steps of photoresist coating, soft baking, mask aligning, exposing pattern, post-exposure baking, developing photoresist, and hard baking. The etching process may include dry etching, wet etching, or combinations thereof. Alternatively, the patterning procedure may further utilize a hard mask to enhance the etching process. For example, a hard mask layer is formed on the underlying material layers and is then patterned to form the hard mask using a lithography process and an etching process. Then, a second etching process is applied to the underlying material layers through the openings of the hard mask. The hard mask is removed by etching or other suitable process after the second etching process. The patterned photoresist layer can be removed before, during, or after the second etching process. In an embodiment, the conductive spacer 56, if present, can be patterned to the disk shape with the magnetic feature 54. Alternatively, the conductive spacer 56 may be patterned to the elliptical shape with the MTJ 52.

The semiconductor memory device 50 further includes a first electrode 58 and a second electrode 60 configured to electrically connect to the magnetic feature 54 and the MTJ 52, respectively. Each of the first and second electrodes 58 and 60 includes a conductive material. In one embodiment, the first and second electrodes include tantalum. Alternatively, the electrodes include other suitable conductive material to electrically connect the device to other portions of the interconnect structure for pre-designed electrical routing. The electrodes may be formed by a PVD process or other suitable process.

With the disclosed structure of the MRAM cell having the disk shaped magnetic feature, the threshold current is reduced without various issues present in conventional MRAM cells, such as manufacturing control and repeatability in a structure having the free magnetic layer with reduced thickness. Further, it is not necessary to use expensive magnetic material with increased production.

Figure 4:
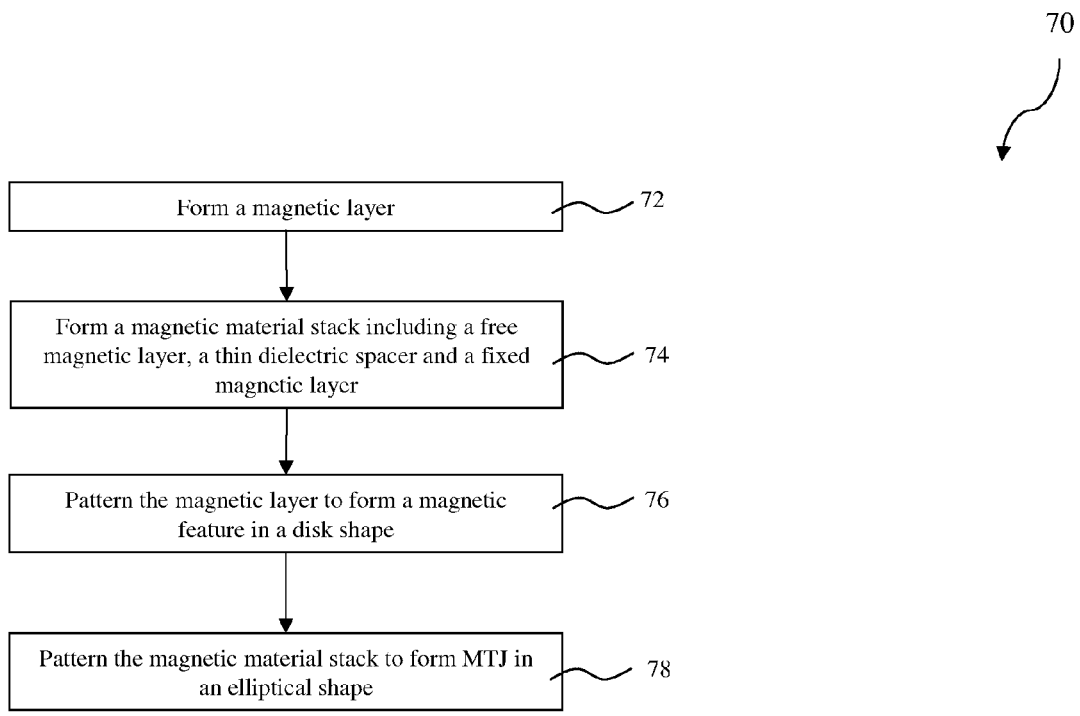
FIG. 4 is a flowchart of a method to form the semiconductor memory device of FIG. 1 constructed according to aspects of the present disclosure.

FIG. 4 is a flowchart of a method 70 for making the semiconductor memory device 50 of FIG. 1 according to one or more embodiments. The method 70 is described with reference to FIGS. 1 and 4. The method 70 includes forming a magnetic layer, designed for the magnetic feature 54, at step 72. The magnetic layer is formed on a substrate by a suitable process, such as PVD. A conductive layer may be formed on the magnetic layer by a process, such as PVD, plating, or combinations thereof.

The method 70 includes a step 74 by forming a magnetic material stack having a free magnetic layer, a thin dielectric spacer, and a fixed magnetic layer configured for a magnetic tunneling effect. Step 74 includes various deposition processes, such as PVD, to form various material layers, respectively. In one embodiment, the magnetic material stack is formed on the magnetic layer.

The method 70 includes a step 76 by patterning the magnetic layer to form the magnetic feature 54 in the disk shape. The step 76 includes a lithography process and an etching process. The lithography process forms a patterned photoresist layer having an opening that defines a disk shape. The etching process may include dry etching, wet etching, or combinations thereof. The step 76 may additionally include forming a hard mask having one or more openings. The etching process may then be applied to the underlying material layers through the openings of hard mask.

The method 70 includes a step 78 by patterning the magnetic material stack to form the MTJ 52 in the elliptical shape. The step 78 is similar to the step 76. For example, the step 78 includes a lithography process and an etching process. The lithography process forms a patterned photoresist layer having an opening that defines an elliptical shape. The etching process may include dry etching, wet etching, or combinations thereof.

Figure 5:
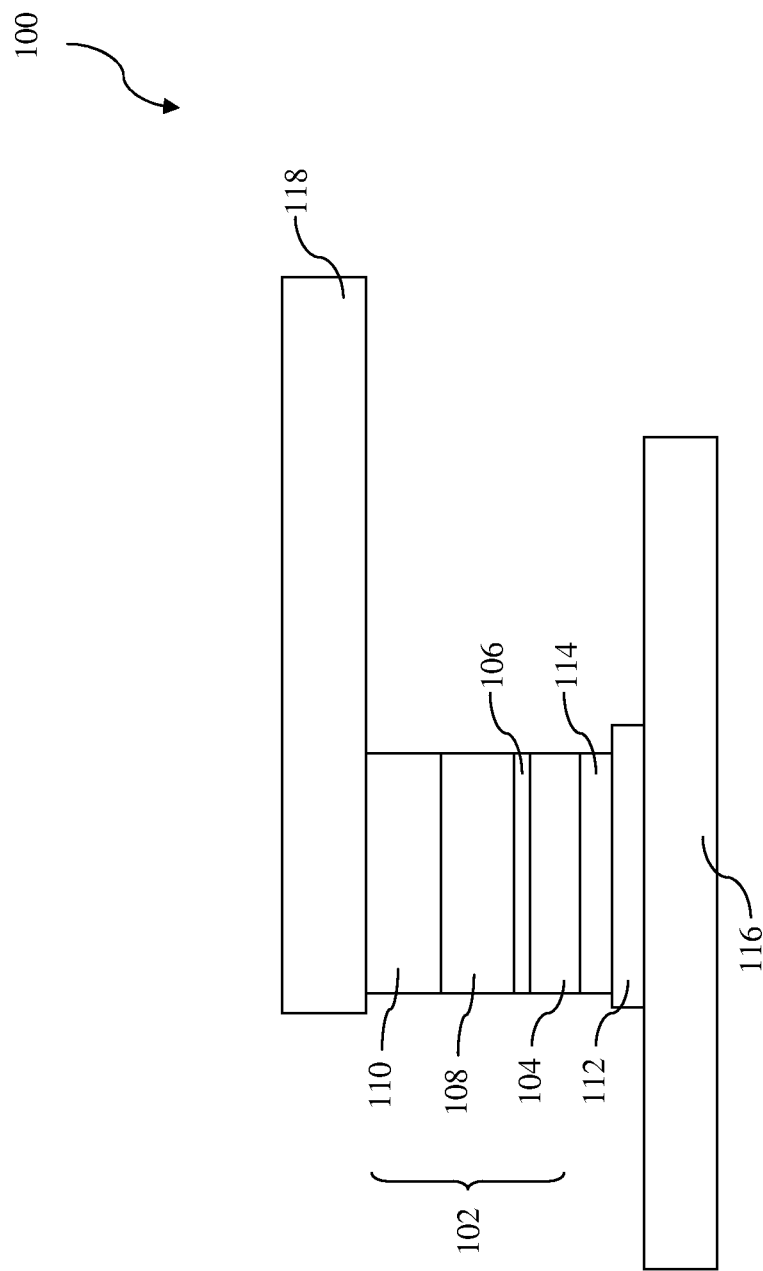
FIGS. 5 through 7 are sectional views illustrating various embodiments of a semiconductor memory device constructed according to various aspects of the present disclosure.

FIG. 5 is a sectional view illustrating an embodiment of a semiconductor memory device 100 constructed according to aspects of the present disclosure. The semiconductor memory device 100 is a portion of a MRAM cell designed with a writing mechanism of spin torque transfer (STT). For simplicity, the following description of the semiconductor memory device 100 will be concise when a similar feature is present previously in the semiconductor memory device 50 of FIGS. 1 and 2. The semiconductor memory device 100 is formed on a semiconductor substrate, such as a silicon substrate (not shown).

The semiconductor memory device 100 includes a magnetic tunnel junction (MTJ) 102 having various material layers configured to achieve magnetic tunneling effect. The MTJ 102 is patterned to have an asymmetric shape in the top view. Particularly, the MTJ 102 is patterned to have an elliptical shape in the top view, similar to the MTJ 52 of the semiconductor memory device 50 of FIGS. 1 and 2.

The MTJ 102 includes a free magnetic layer 104. The free magnetic layer 104 includes ferromagnetic material. The free magnetic layer 104 is similar to the free magnetic layer of FIG. 1 in terms of composition and formation. For example, the ferromagnetic material can form permanent magnets and/or exhibit strong interactions with magnets. In one embodiment, the ferromagnetic material includes a cobalt-iron-boron (CoFeB) film. In another embodiment, the ferromagnetic material may additionally include other materials, such as Ta, Ru, or NiFe. In yet another embodiment, the ferromagnetic material layer may alternatively include other materials, such as CoFeTa, NiFe, Co, CoFe, CoPt, CoPd, or alloy of Ni, Co, and Fe.

The MTJ 102 includes a thin dielectric spacer (or a barrier layer) 106 disposed on the free magnetic layer 104. The thin dielectric spacer 106 includes a dielectric material layer and is configured between the free magnetic layer 104 and the fixed magnetic layer 108 for tunneling effect. In one embodiment, the thin dielectric spacer 106 includes magnesium oxide (MgO). Alternatively, the thin dielectric layer 106 may include aluminum oxide (AlO), aluminum nitride (AlN), aluminum oxynitride (AlON), or other suitable non-magnetic material. The thin dielectric spacer 106 is thin enough such that electrons can tunnel through the thin dielectric spacer 106 when a bias voltage is applied.

The MTJ 102 also includes a fixed magnetic layer (or a pinned magnetic layer) 108 disposed on the thin dielectric spacer 106. The fixed magnetic layer 108 is disposed directly on the thin dielectric spacer 106. In one embodiment, the fixed magnetic layer 108 includes a ferromagnetic material. In one embodiment, the ferromagnetic layer of the fixed magnetic layer 108 includes a cobalt-iron-boron (CoFeB) film. In another embodiment, the ferromagnetic material of the fixed magnetic layer 108 includes NiFe, CoFeTa, Co, CoFe, CoPt, or CoPd.

The MTJ 102 may include a pinning layer 110 configured adjacent the fixed magnetic layer 108 for pinning effect and is disposed directly on the fixed magnetic layer 108. In one embodiment, the pining layer 110 includes an anti-ferromagnetic material. In one example, the pinning layer 110 includes platinum manganese (PtMn). In another example, the pinning layer 110 includes iridium manganese (IrMn). Alternatively, the pinning layer 110 may be avoided, where the fixed magnetic layer 108 is thick enough to achieve a self-pining effect.

The semiconductor memory device 100 includes a magnetic feature 112 disposed underlying the MTJ 102. The magnetic feature 112 includes a ferromagnetic material, such as CoFeB or NiFe. The magnetic feature 112 is similar to the magnetic feature 54 of the semiconductor memory device 50 of FIGS. 1 and 2 in terms of geometry. For example, the magnetic feature 112 is patterned to a symmetric shape in the top view, such as the magnetic feature 54 illustrated in FIG. 2. Particularly, the magnetic feature 112 has a disk shape in the top view.

The semiconductor memory device 100 also includes a conductive layer (or conductive spacer) 114 disposed between the free magnetic layer 104 and the magnetic feature 112. The conductive layer 114 includes copper or other suitable conductive material formed by PVD, plating, or other suitable process. In one embodiment, the conductive layer 114 is patterned to an elliptical shape similar to the shape of the MTJ 102. In an alternative embodiment, the conductive layer 114 is patterned to a disk shape similar to the shape of the magnetic feature 112. The conductive spacer 114 directly contacts the overlying free magnetic layer 104 and the underlying magnetic feature 112. The magnetic feature 112 is coupled to the free magnetic layer 104 through the conductive feature 114 to tilt orientations of the electron spins in the free magnetic layer 104, thereby reducing the threshold current of the MTJ 102.

The semiconductor memory device 100 also includes a first electrode 116 disposed underlying the magnetic feature 112 and a second electrode 118 disposed on the pinning layer 110. In one embodiment, the first electrode 116 is configured to directly contact the magnetic feature 112 and the second electrode 118 is configured to directly contact the pinning layer 110. The first and second electrodes 116 and 118 include tantalum or other suitable metal or conductive material.

Figure 6:
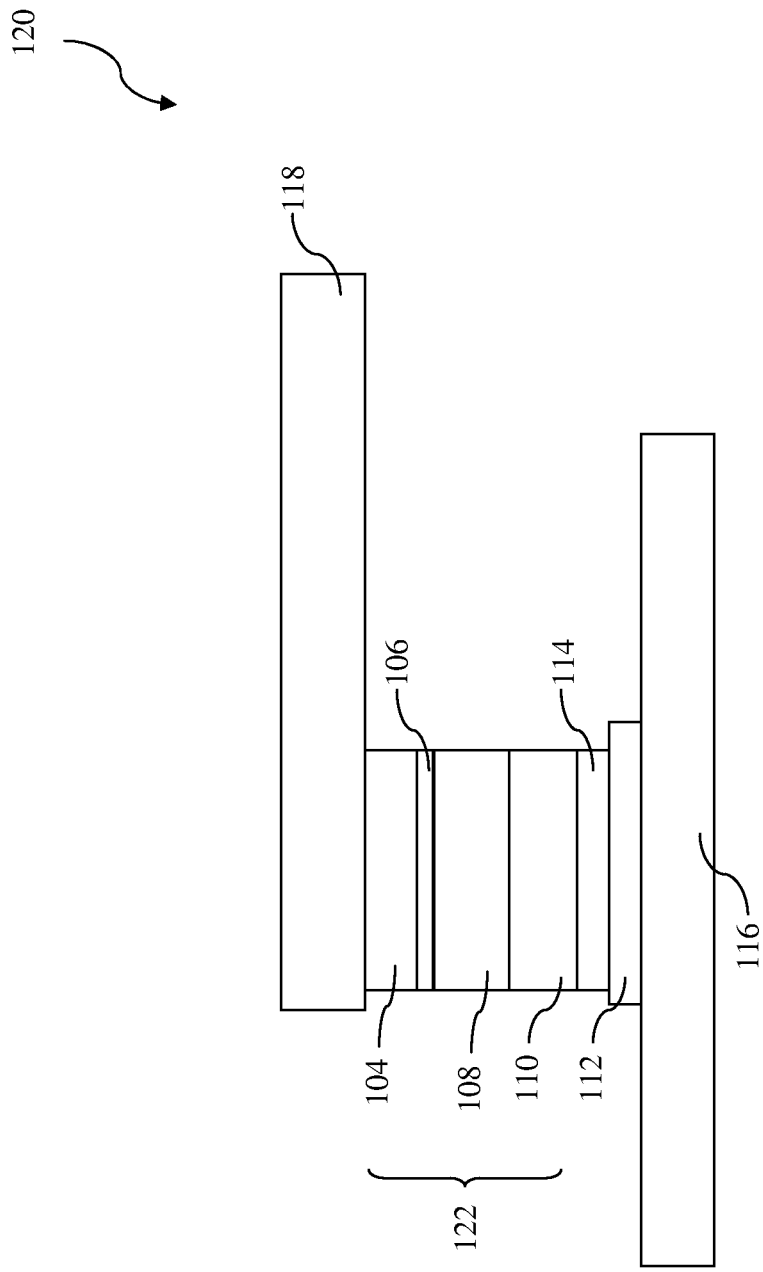

FIG. 6 is a sectional view illustrating another embodiment of a semiconductor memory device 120 constructed according to various aspects of the present disclosure. The semiconductor memory device 120 is a portion of a MRAM cell designed with a writing mechanism of spin torque transfer (STT). The semiconductor memory device 120 is formed on a semiconductor substrate, such as silicon substrate.

The semiconductor memory device 120 includes a magnetic tunnel junction (MTJ) 122 having various material layers configured to achieve magnetic tunneling effect. The MTJ 122 is patterned to have an asymmetric shape in the top view. Particularly, the MTJ 122 is patterned to have an elliptical shape in the top view, similar to the MTJ 52 of the semiconductor memory device 50 of FIGS. 1 and 2. The MTJ 122 is similar to the MTJ 102 of the semiconductor memory device 100 in FIG. 5 in terms of the composition and formation but is designed and constructed in a different configuration. Particularly, the fixed magnetic layer 108 is disposed on the pining layer 110. The free magnetic layer 104 is disposed on the fixed magnetic layer 108. The thin dielectric spacer 106 is disposed between the free magnetic layer 104 and the fixed magnetic layer 108 for tunneling effect.

The magnetic feature 112 is similar to the magnetic feature 112 of the semiconductor memory device 100 of FIG. 5. For example, the magnetic feature 112 includes a ferromagnetic material, such as CoFeB. In another example, the magnetic feature 112 includes NiFe. The magnetic feature 112 is patterned to a symmetric shape in the top view such as the magnetic feature 54 illustrated in FIG. 2. Particularly, the magnetic feature 112 has a disk shape in the top view.

The conductive spacer 114 is disposed between the pining layer 110 and the magnetic feature 112. The conductive spacer 114 directly contacts the overlying pining layer 110 and the underlying magnetic feature 112. The magnetic feature 112 is coupled to the pining layer 110 and further to the fixed magnetic layer 108 through the conductive feature 114 to tilt orientations of the electron spins in the fixed magnetic layer 108, thereby reducing the threshold current of the MTJ 122. Alternatively, the pinning layer 110 may be eliminated, and the fixed magnetic layer 108 is thick enough to achieve a self-pining effect. In this case, the conductive spacer 114 is disposed between the fixed magnetic layer 108 and the magnetic feature 112. The conductive spacer 114 directly contacts the overlying fixed magnetic layer 108 and the underlying magnetic feature 112. The magnetic feature 112 is coupled to the fixed magnetic layer 108 through the conductive feature 114 to tilt orientations of the electron spins in the fixed magnetic layer 108, thereby reducing the threshold current of the MTJ 122.

Figure 7:
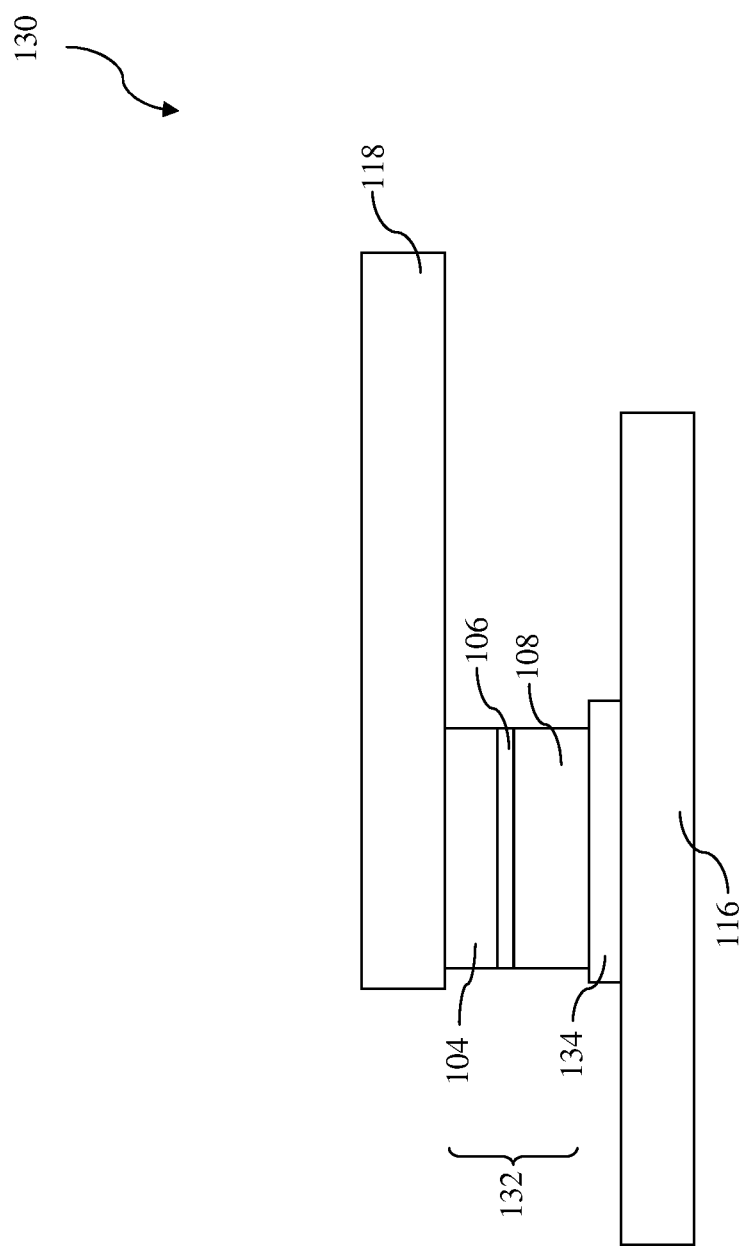

FIG. 7 is a sectional view illustrating another embodiment of a semiconductor memory device 130 constructed according to various aspects of the present disclosure. The semiconductor memory device 130 is a portion of a MRAM cell designed with a writing mechanism of spin torque transfer. The semiconductor memory device 130 is formed on a semiconductor substrate, such as silicon substrate.

The semiconductor memory device 130 includes a magnetic tunnel junction (MTJ) 132 having various material layers configured to achieve magnetic tunneling effect. The MTJ 132 is patterned to have an asymmetric shape in the top view. Particularly, the MTJ 132 is patterned to have an elliptical shape in the top view, similar to the MTJ 52 of the semiconductor memory device 50 of FIGS. 1 and 2. The MTJ 132 is similar to the MTJ 122 of the semiconductor memory device 120 in FIG. 6 in terms of the composition, configuration, and formation. However, the pining layer 110 and the conductive feature 114 are eliminated.

In furtherance of the present embodiment, a magnetic feature 134 is disposed underlying the fixed magnetic layer 108 and directly contacts the fixed magnetic layer 108, as illustrated in FIG. 7. The magnetic feature 134 includes an anti-ferromagnetic material. Thus, the magnetic feature 134 also serves for pinning effect to pin orientations of the electron spins in the fixed magnetic layer 108. In one example, the anti-ferromagnetic material includes platinum manganese (PtMn). In another example, the anti-ferromagnetic material includes iridium manganese (IrMn).

The magnetic feature 134 is similar to the magnetic feature 52 of the semiconductor memory device 50 in terms of geometry. The magnetic feature 134 is designed to have a symmetric shape in the top view such as the magnetic feature 54 illustrated in FIG. 2. Particularly, the magnetic feature 134 has a disk shape in the top view. Similarly, electron spins of the magnetic feature 134 are also tiled toward the vertical direction due to geometric constraints of the disk shape. With the magnetic feature 134 configured adjacent the fixed magnetic layer 108, the fixed magnetic layer 108 is pinned thereby and the orientation of the electron spins of the fixed magnetic layer 108 are tilted toward the vertical direction as well. The threshold current of the corresponding MRAM cell is reduced accordingly.

Figure 8:
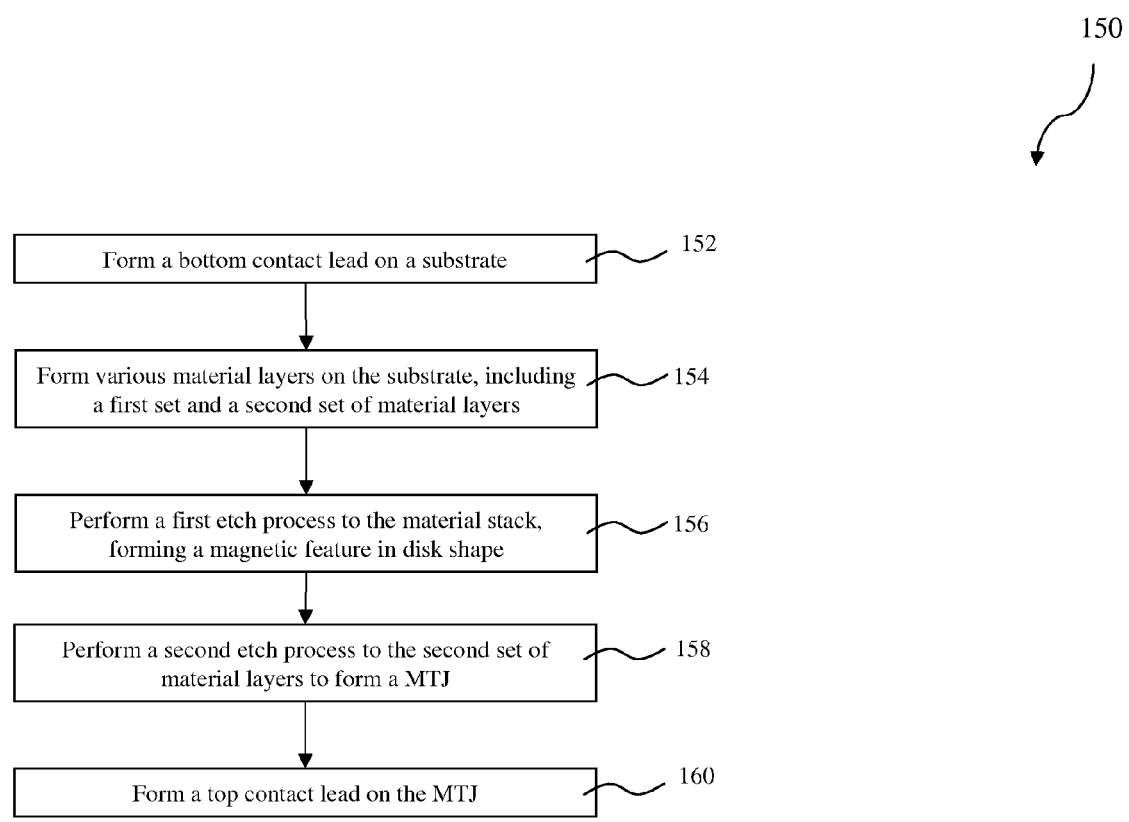
FIG. 8 is a flowchart of a method to form a semiconductor memory device constructed according to aspects of the present disclosure.

FIG. 8 is a flowchart of a method 150 for fabricating a semiconductor memory device according to one or more embodiments. FIGS. 9 through 14 are schematic views of a semiconductor memory device 170 in various fabrication stages according one or more embodiments. The semiconductor memory device 170 is fabricated by the method 150. With reference to FIGS. 8 through 14, the method 150 and the semiconductor memory device 170 are collectively described.

Figure 9:
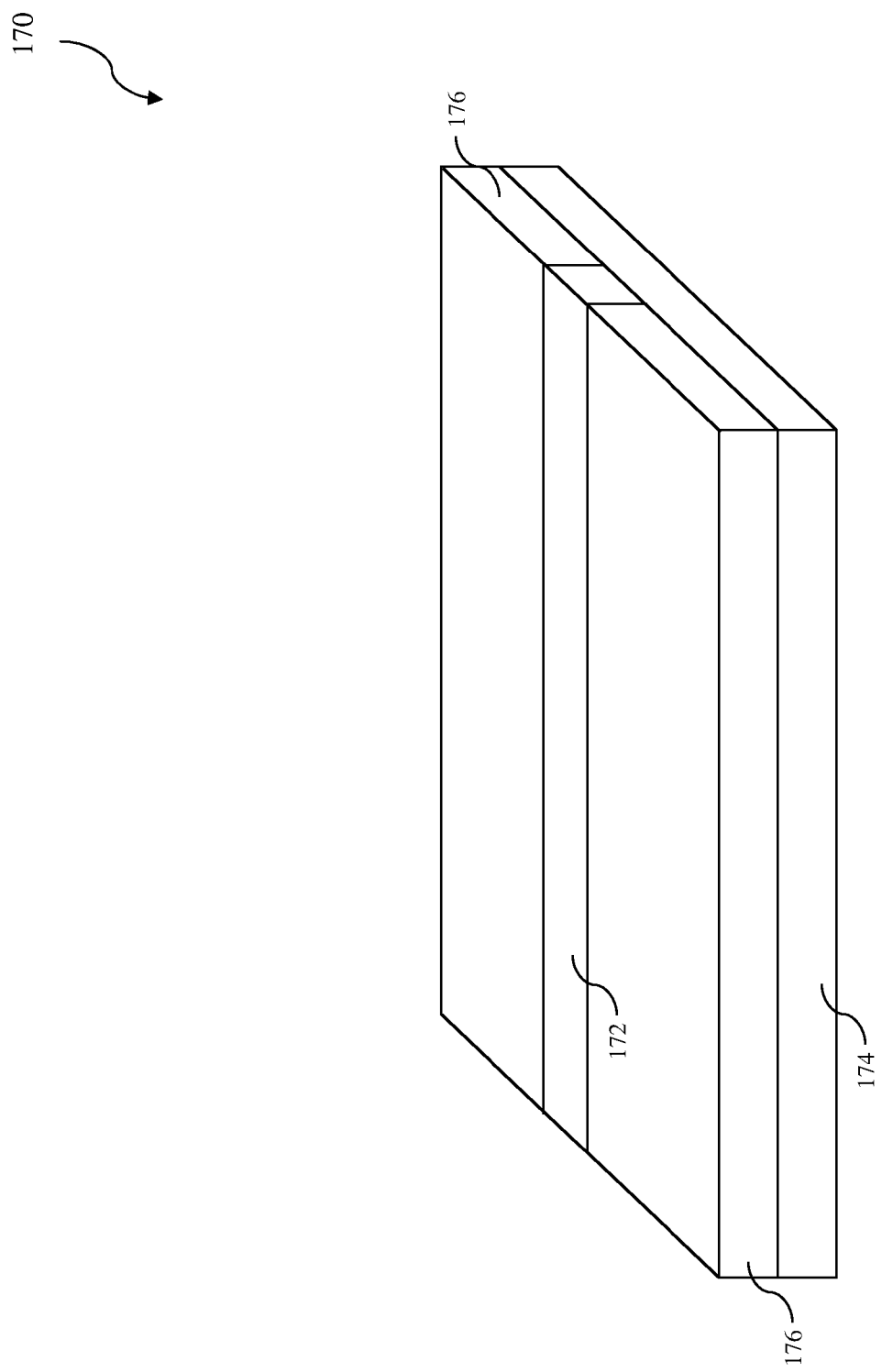
FIGS. 9 through 14 are schematic views of the semiconductor memory device at various manufacturing stages of FIG. 8.

Referring to FIGS. 8 and 9, the method 150 begins at step 152 by forming a bottom contact lead (or bottom electrode) 172 on a substrate 174. The substrate 174 includes silicon or other suitable semiconductor material. The bottom contact lead 172 includes a conductive material such as a metal including tantalum, copper, aluminum, and tungsten. The conductive material is deposited on the substrate 174 and then is patterned to form the bottom contact lead 172. The deposition may include PVD, plating, CVD, combinations thereof, or other suitable processes. The patterning process may include a lithography process and an etching process, such as a dry etch or a wet etch.

A dielectric material layer 176, such as silicon oxide, is formed on the substrate 174 for isolation. The dielectric material 176 can be formed by CVD or other suitable process. A chemical mechanical polishing (CMP) process may be additionally applied to polish the surface of the dielectric material layer 176 and the bottom contact lead 172.

Alternatively, the bottom contact lead 172 can be formed by a damascene process. For example, the dielectric material layer 176 is formed on the substrate 174 and is further patterned to form a trench. Then, the conductive material is deposited by a procedure, such as PVD or plating. A CMP process is applied to polish and remove the excess conductive material from the dielectric material layer 176.

Figure 10:
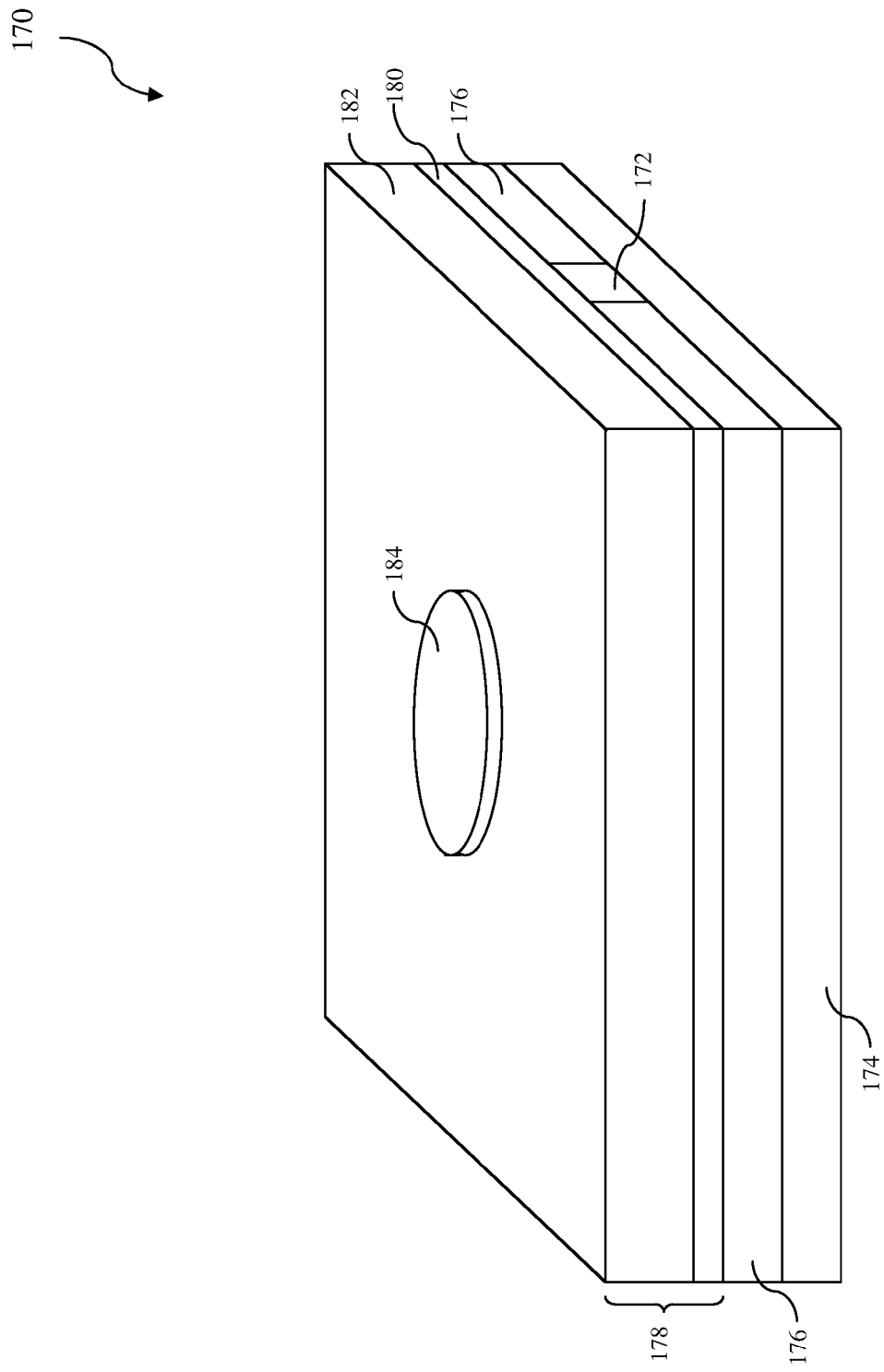

Referring to FIGS. 8 and 10, the method 150 includes forming a material stack 178 having various material layers at step 154. The material stack includes a first set of material layer(s) 180 for a magnetic feature, such as the magnetic feature 54 of FIG. 1, and a second set of material layers 182 for a MTJ, such as the MTJ 52 of FIG. 1.

In a first embodiment, the material stack 178 is substantially similar to the stack of materials between the two electrodes in the semiconductor memory device 100 in FIG. 5. The first set of material layers 180 includes a magnetic layer. The magnetic layer includes a ferromagnetic material, such as CoFeB or NiFe. The first set of material layers 180 also includes a conductive layer disposed on the magnetic layer. The conductive layer includes copper or other suitable conductive material. The formation of the magnetic layer and the conductive layer may include PVD, CVD, atomic layer deposition, plating, combinations thereof, or other suitable processes.

In the first embodiment, the second set of material layers 182 includes a free magnetic layer disposed on the conductive layer of the first set of material layers 180. The free magnetic layer includes ferromagnetic material. In various examples, the ferromagnetic material includes a cobalt-iron-boron (CoFeB), NiFe, or other suitable ferromagnetic material. The second set of material layers 182 includes a thin dielectric layer disposed on the free magnetic layer. The thin dielectric layer includes magnesium oxide (MgO). Alternatively, the thin dielectric layer may include aluminum oxide (AlO), aluminum nitride (AlN), aluminum oxynitride (AlON), or other suitable non-magnetic material. The second set of material layers 182 also includes a fixed magnetic layer (or a pinned magnetic layer) disposed on the thin dielectric spacer. In one embodiment, the fixed magnetic layer includes a ferromagnetic material, such as cobalt-iron-boron (CoFeB), NiFe, or other suitable ferromagnetic material. The second set of material layers 182 may include a pinning layer formed on the fixed magnetic layer for pinning effect. The pining layer includes an anti-ferromagnetic material, such as platinum manganese (PtMn), iridium manganese (IrMn) or other suitable anti-ferromagnetic material. Alternatively, the pinning layer may be eliminated when the fixed magnetic layer is thick enough to achieve self-pining effect. The formation of the second set of material layers 182 may include PVD, CVD, atomic layer deposition, combinations thereof, or other suitable processes.

In a second embodiment, the material stack 178 is substantially similar to the stack of materials between the two electrodes in the semiconductor memory device 120 in FIG. 6. The first set of material layers 180 includes a magnetic layer. The magnetic layer includes a ferromagnetic material, such as CoFeB or NiFe. The first set of material layers 180 also includes a conductive layer disposed on the magnetic layer. The conductive layer includes copper or other suitable conductive material.

In the second embodiment, the second set of material layers 182 includes a pinning layer formed on the conductive layer of the first set of material layers 180. The pining layer includes an anti-ferromagnetic material, such as platinum manganese (PtMn), iridium manganese (IrMn), or other suitable anti-ferromagnetic material. The second set of material layers 182 includes a fixed magnetic layer disposed on the pining layer. In one embodiment, the fixed magnetic layer includes a ferromagnetic material, such as cobalt-iron-boron (CoFeB), NiFe, or other suitable ferromagnetic material. The second set of material layers 182 includes a thin dielectric layer disposed on the fixed magnetic layer. The thin dielectric layer includes magnesium oxide (MgO) or other suitable non-magnetic material. The second set of material layers 182 also includes a free magnetic layer disposed on the thin dielectric layer. The free magnetic layer includes ferromagnetic material. In various examples, the ferromagnetic material includes a cobalt-iron-boron (CoFeB), NiFe, or other suitable ferromagnetic material. Alternatively, the pinning layer may be eliminated when the fixed magnetic layer is thick enough to achieve self-pining effect.

In a third embodiment, the material stack 178 is substantially similar to the stack of materials between the two electrodes in the semiconductor memory device 130 in FIG. 7. The first set of material layers 180 includes a magnetic layer. The magnetic feature includes an anti-ferromagnetic material, such as platinum manganese (PtMn), iridium manganese (IrMn), or other suitable anti-ferromagnetic material. The second set of material layers 182 includes a fixed magnetic layer disposed on the magnetic layer. In one embodiment, the fixed magnetic layer includes a ferromagnetic material, such as CoFeB, NiFe, or other suitable ferromagnetic material.

The second set of material layers 182 includes a thin dielectric layer disposed on the fixed magnetic layer. The thin dielectric layer includes MgO or other suitable non-magnetic material. The second set of material layers 182 also includes a free magnetic layer disposed on the thin dielectric layer. The free magnetic layer includes ferromagnetic material. In various examples, the ferromagnetic material includes a CoFeB, NiFe, or other suitable ferromagnetic material.

Still referring to FIG. 10, the method 150 further includes forming a hard mask (or photoresist layer) 184 on the material stack 178 and patterning the hard mask to have a portion in a disk shape. The hard mask 184 includes one dielectric material layer having a higher etch resistance during subsequent etching processes. In one embodiment, the hard mask 184 includes silicon nitride. The hard mask 184 can be patterned using a patterned photoresist layer as an etch mask as known in the art.

Figure 11:
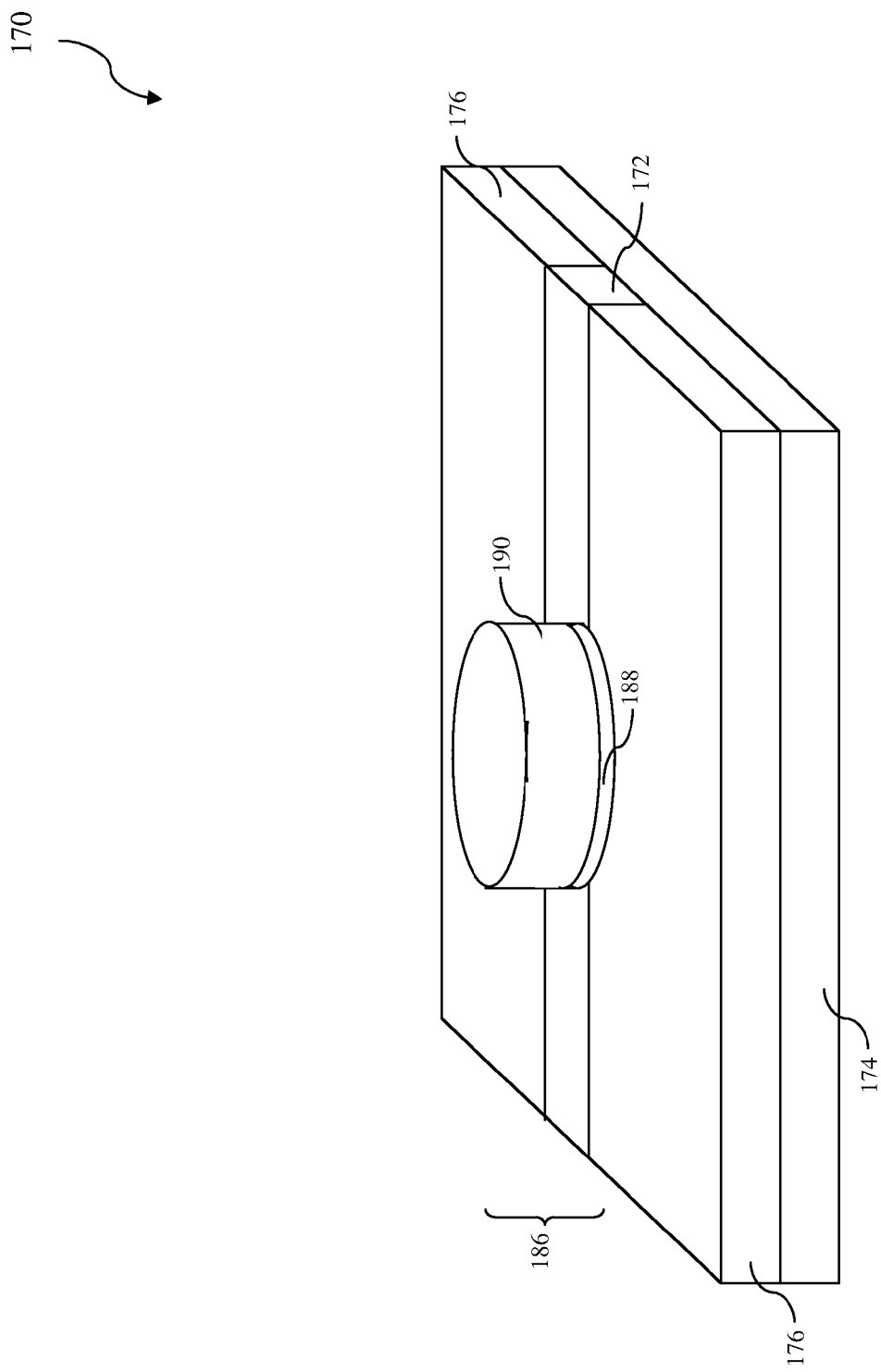

Referring to FIGS. 8 and 11, the method 150 includes a first etch process applied to the material stack 178 at step 156, forming the patterned material stack 186 including the patterned first set of material layer(s) 188 and the patterned second set of material layers 190. In one embodiment, the first etch process includes a dry etch. For example, the dry etch uses fluorine containing plasma. In another example, the dry etch may include more than one sub-step, each with different etching parameters or etchant tuned to effectively etch certain material layers of the material stack 178. Thereafter, the hard mask (or patterned photoresist layer) 184 is removed.

The patterned material stack 178 is illustrated in FIG. 11 and includes the first set of material layer(s) 180 as the magnetic feature similar to the magnetic feature 52 described in FIG. 2. In the top view, the magnetic feature is in a disk shape that defines a first dimension D1 in a first direction and a second dimension D2 in a second direction perpendicular to the first direction. The parameters D1 and D2 define a ratio D1/D2 substantially equal to 1. In one embodiment, the ratio D1/D2 of the magnetic feature ranges from about 0.9 and about 1.1. Preferably, the ratio is equal to 1 or D1 is equal to D2, referred to as D. In one embodiment, the parameters D is about 90 nanometers.

Figure 12:
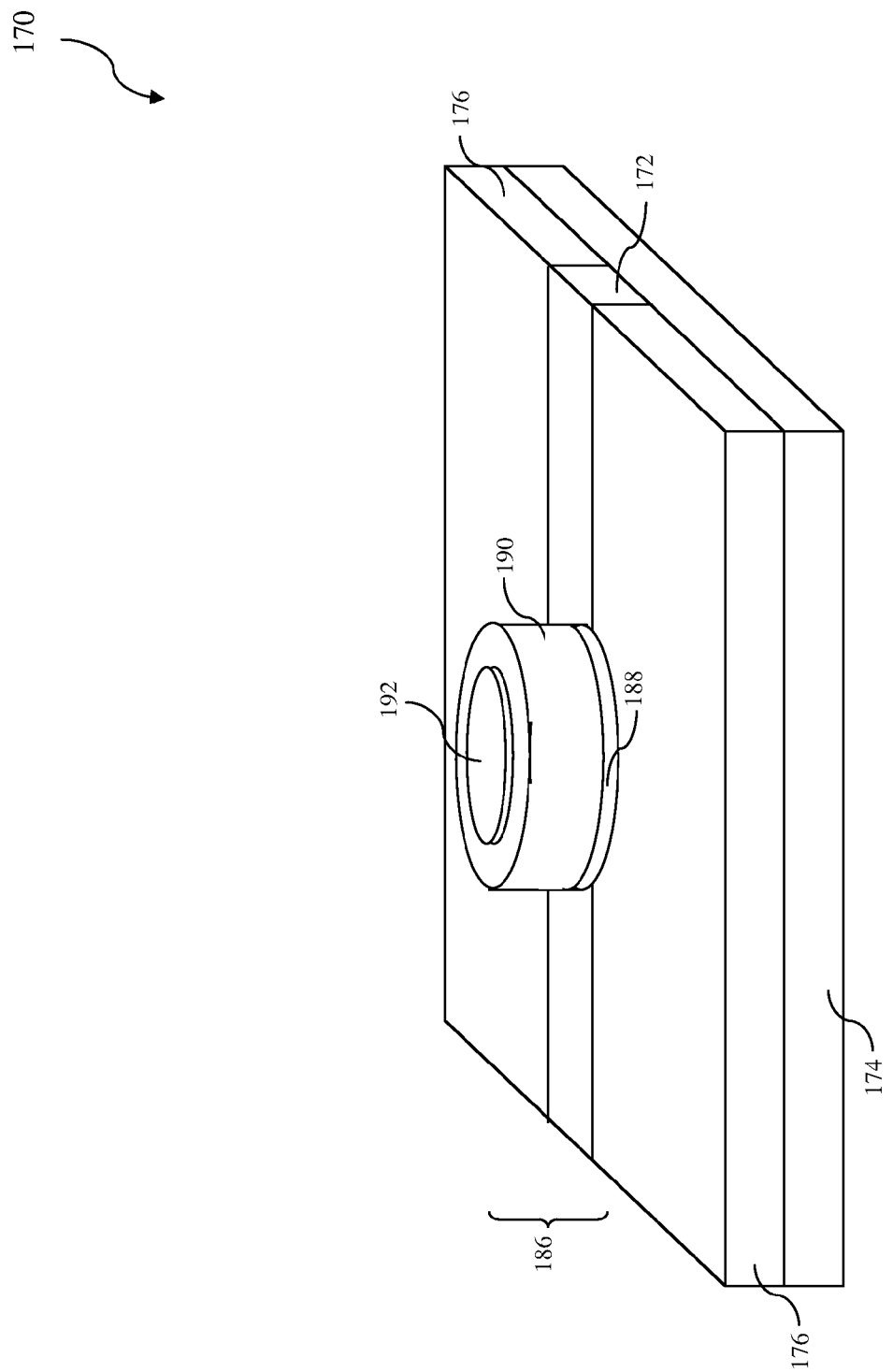

Referring to FIG. 12, the method 150 further includes forming another hard mask (or photoresist layer) 192 on the patterned material stack 186 and patterning the hard mask 192 to have a portion in an elliptical shape. The hard mask 192 includes one dielectric material layer having higher etch resistance during subsequent etching processes. In one embodiment, the hard mask 192 includes silicon nitride. The hard mask 192 can be patterned using a patterned photoresist layer as an etch mask as known in the art.

Figure 13:
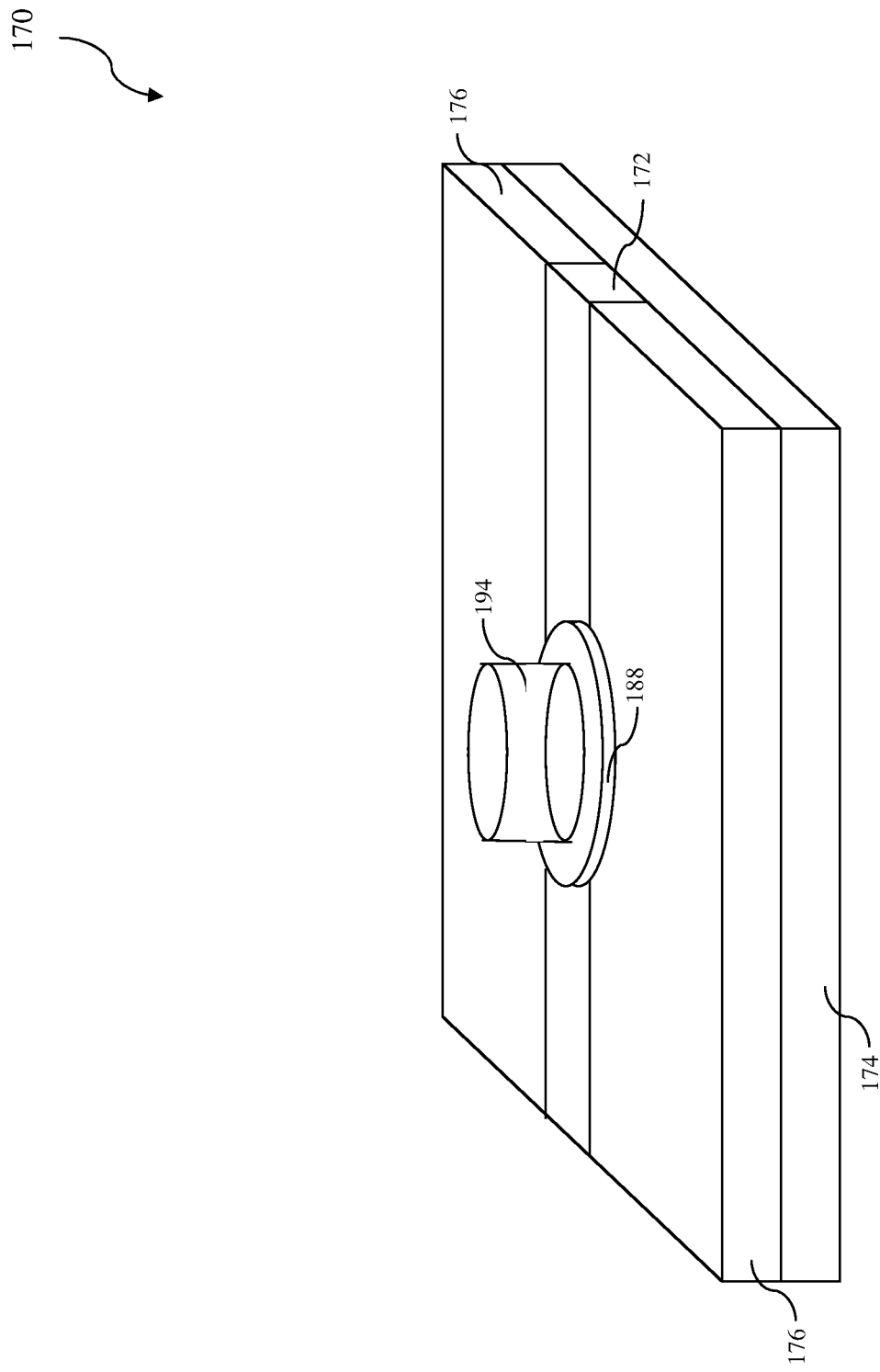

Referring to FIGS. 8 and 13, the method 150 includes a second etch process applied to the patterned second set of material layers stack 190 at step 158, forming the MTJ 194. In one embodiment, the first etch process includes a dry etch. For example, the dry etch uses fluorine containing plasma. In another example, the dry etch may include more than one sub-step, each with different etching parameters or etchant tuned to effectively etch certain material layers of the second set of material layers 190. The hard mask (or patterned photoresist layer) 192 is removed thereafter.

The MTJ 194 is designed to have an asymmetric shape in the top view, such as the MTJ 52 illustrated in FIG. 2. Particularly, the MTJ 194 in the top view defines an elliptical shape having a third dimension D3 in the first direction and a fourth dimension D4 in the second direction. D3 is substantially greater than D4. Further, the parameters D3 and D4 define a ratio D3/D4 substantially greater than 1. In one embodiment, the ratio D3/D4 of the MTJ 194 is greater than or equal to 1.5.

Figure 14:
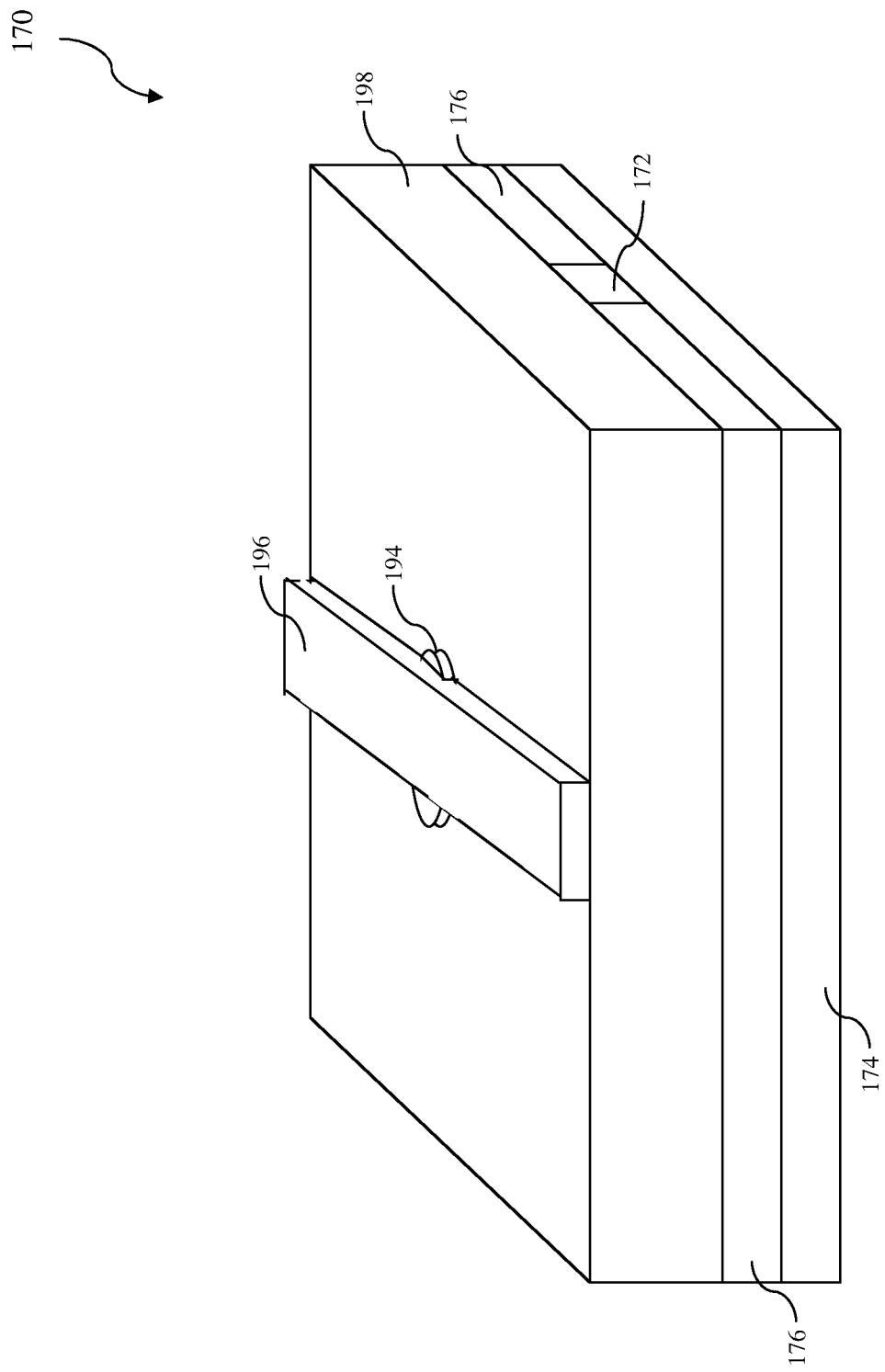

Referring to FIGS. 8 and 14, the method 150 includes a step 160 by forming a top contact lead (or top electrode) 196 on the MTJ 194. First, a dielectric layer 198 is formed on the substrate 174. The dielectric layer 198 includes silicon oxide, low-k dielectric material, or other suitable dielectric material. The dielectric layer 198 has a certain thickness such that the top surface of the MTJ 194 is exposed. Then, a conductive material is deposited on the MTJ 194 and is patterned to form the top contact lead 196. The deposition of the conductive material may include PVD. In various embodiments, the top contact lead 196 includes tantalum, aluminum, or other suitable conductive material. The patterning process may include a lithography process and an etching process, such as a dry etch or a wet etch. In an alternative embodiment, a damascene process may be implemented to form the top contact lead 196. In furtherance of the embodiment, the dielectric layer 198 substantially covers the MTJ 194. A trench is formed in the dielectric layer 198 exposing the top surface of the MTJ 194 and defining a region for the top contact lead. A conductive material is deposited on the substrate to substantially fill in the trench. Then, a CMP process is performed to polish and remove the excess conductive material on the surface of the dielectric material layer 198.

Figure 15:
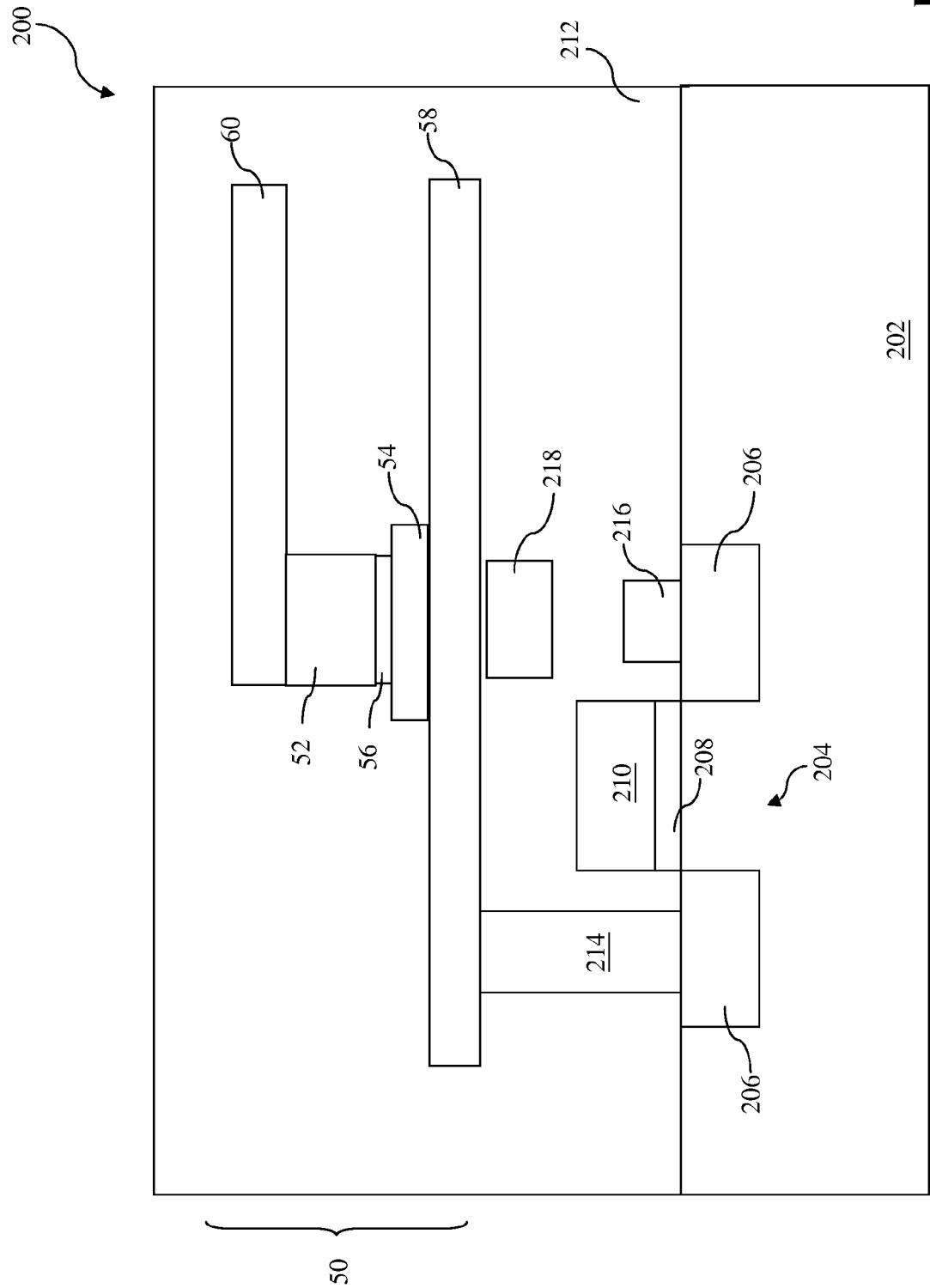
FIG. 15 is a sectional view illustrating an integrated circuit constructed according to aspects of the present disclosure.

FIG. 15 is a sectional view illustrating one embodiment of an integrated circuit 200 constructed according to aspects of the present disclosure. The integrated circuit 200 includes the semiconductor memory device 50 of FIG. 1 and various other features configured as a MRAM cell in one embodiment. The integrated circuit 200 includes a silicon substrate 202. In other embodiments, the substrate 202 may alternatively or additionally include other semiconductor material, such as germanium, gallium arsenic, and diamond. The substrate 202 further includes various doped features, such as n-type wells and/or p-type wells, formed by ion implantation or diffusion. The substrate 202 also includes various isolation features, such as shallow trench isolation (STI), formed by a process known in the art, such as a process including etching to form various trenches and then deposition to fill the trench with a dielectric material using CVD.

The integrated circuit 200 further includes a metal-oxide-silicon (MOS) transistor 204. The MOS transistor 204 includes source and drain regions 206 formed by a process, such as ion implantation. The MOS transistor 204 further includes a gate stack interposed between the source and drain regions 206. The gate stack includes a gate dielectric 208 disposed on the substrate and a gate electrode 210 disposed on the gate dielectric 208. The gate dielectric 208 includes one or more dielectric films vertically interposed between the gate electrode and the substrate. In one example, the gate dielectric 208 includes a silicon oxide film formed by a thermal oxidation. In another example, the gate dielectric 208 includes a high-k film and may additionally include a thermal silicon oxide. The high-k film is a dielectric material having a dielectric constant greater than that of the silicon oxide. The high-k film, such as hafnium oxide, can be formed by a process such as ALD, or other suitable method. The gate electrode 210 includes one or more conductive materials, such as doped polysilicon, metal, metal alloy, or combinations thereof. The gate electrode 210 can be formed by CVD, PVD, or other suitable method. In another embodiment, spacers may be formed adjacent the gate electrodes.

The integrated circuit 200 also includes interconnects on the substrate. The interconnects are designed for electrical connection and routing to enable the integrated circuit to function according to its design. In one example, the interconnects are extended to and electrically connected to the MOS transistor 204. The interconnects include various conductive features formed in a dielectric material 212 for proper isolation. The various conductive features include contacts, metal one (e.g., M1) lines, vias, and high level metal lines. The various conductive features may include copper, tungsten, titanium, titanium nitride, gold, aluminum, alloy, carbon nano-tubes, and/or other suitable materials, and may be formed by CVD, PVD, plating, and/or other processes. The interconnects may have a homogenous or heterogeneous structure. For example, each conductive feature includes a lining layer possibly having titanium, titanium nitride, tantalum, or tantalum nitride; and a bulk conductive layer having copper, tungsten, aluminum, or aluminum alloy. In another example, the conductive features are formed in a damascene process, including trench etch, deposition and chemical mechanical polishing (CMP).

In the present embodiment, the interconnects include first, second, and third conductive features 214, 216, and 218. In furtherance of the present embodiment, the first conductive feature 214 lands on one of the source/drain regions 206 and is electrically coupled to the MTJ 52. The second conductive feature 216 is a contact landed on another one of the source/drain regions 206.

In the integrated circuit 200, the MTJ 52 in the elliptical shape is coupled with the magnetic feature 54 in the disk shape (through the conductive spacer 56 or alternatively without the conductive spacer), resulting in reduced threshold current. The MOS transistor 204 provides a control of a writing operation to the MTJ 52 by the STT mechanism.

Thus, the present disclosure provides a semiconductor memory device. The semiconductor memory device includes a magnetic tunneling junction (MTJ); and a magnetic feature aligned with the MTJ and approximate the MTJ. When viewed in a direction perpendicular to the MTJ and the magnetic feature, the magnetic feature has a disk shape, and the MTJ has an elliptical shape and is positioned within the disk shape.

The present disclosure also provides another embodiment of a memory device. The memory device includes a magnetic tunneling junction (MTJ); and a magnetic feature approximate the MTJ. When viewed in a direction perpendicular to the MTJ and the magnetic feature, the MTJ is disposed within the magnetic feature; the magnetic feature has a first shape defining a first dimension D1 in a first direction and a second dimension D2 in a second direction perpendicular to the first direction; D1 is substantially equal to D2; the MTJ has a second shape defining a third dimension D3 in the first direction and a fourth dimension D4 in the second direction; and D3 is substantially greater than D4 and D3 is less than or equal to D1.

The present disclosure also provides an embodiment of a method for making a memory device. The method includes forming a magnetic layer on a substrate; forming a material stack including a first ferromagnetic layer on the magnetic layer, a thin dielectric spacer layer on the first ferromagnetic layer, and a second ferromagnetic layer on the thin dielectric spacer layer; performing a first patterning process to pattern the magnetic layer to a disk shape; and performing a second patterning process to pattern the material stack to an elliptical shape, forming a magnetic tunneling junction (MTJ).

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A memory device, comprising:
   a magnetic tunneling junction (MTJ); and
   a magnetic feature aligned with the MTJ and approximate the MTJ, wherein the magnetic feature has a disk shape and the MTJ has an elliptical shape and is positioned within the disk shape, wherein the disk shape of the magnetic feature disk defines a first dimension D1 in a first direction and a second dimension D2 in a second direction perpendicular to the first direction, wherein D1 is substantially equal to D2.

2. The memory device of claim 1, wherein the MTJ includes a free magnetic layer and a fixed magnetic layer separated by a thin dielectric material layer.

3. The memory device of claim 2, wherein the free magnetic layer includes a first ferromagnetic layer and the fixed magnetic layer includes a second ferromagnetic layer.

4. The memory device of claim 3, wherein the second ferromagnetic layer is thicker than the first ferromagnetic layer.

5. The memory device of claim 3, wherein the magnetic feature includes a third ferromagnetic layer separated from the MTJ by a conductive layer.

6. The memory device of claim 5, wherein the conductive layer is adjacent the first ferromagnetic layer.

7. The memory device of claim 5, wherein the MTJ further includes an anti-ferromagnetic layer adjacent the second ferromagnetic layer and the conductive layer is adjacent the anti-ferromagnetic layer.

8. The memory device of claim 3, wherein the magnetic feature includes an anti-ferromagnetic layer adjacent the second ferromagnetic layer of the MTJ.

9. The memory device of claim 3, wherein the magnetic feature includes one of CoFeB and NiFe.

10. The memory device of claim 1, wherein
    the disk shape of the magnetic feature defines a diameter D; and
    the elliptical shape of the MTJ defines a first third dimension D3 in the first direction and a fourth dimension D4 in the second direction perpendicular to the first direction, wherein D3 is substantially greater than D4 and D is greater than or equal to D3.

11. A memory device, comprising:
    a magnetic tunneling junction (MTJ); and
    a magnetic feature approximate the MTJ, wherein when the memory device is viewed in a top view:
      the MTJ is disposed within the magnetic feature,
      the magnetic feature has a first shape defining a first dimension D1 in a first direction and a second dimension D2 in a second direction perpendicular to the first direction, D1 being substantially equal to D2,
      the MTJ has a second shape defining a third dimension D3 in the first direction and a fourth dimension D4 in the second direction, and
      D3 is substantially greater than D4 and D3 is less than or equal to D1.

12. The memory device of claim 11, wherein a ratio D3/D4 is greater than about 1.5.

13. The memory device of claim 11, wherein a ratio D1/D2 ranges between about 0.9 and about 1.1.

14. The memory device of claim 11, wherein
the MTJ includes a first ferromagnetic layer and a second ferromagnetic layer separated by a thin dielectric spacer, and an anti-ferromagnetic layer adjacent the second ferromagnetic layer and remote from the spacer;
the magnetic feature includes a third ferromagnetic layer; and
a conductive layer disposed between the anti-ferromagnetic layer and the third ferromagnetic layer.

15. The memory device of claim 11, wherein
the MTJ includes a first ferromagnetic layer and a second ferromagnetic layer separated by a thin dielectric spacer, and an anti-ferromagnetic layer adjacent the second ferromagnetic layer and remote from the spacer;
the magnetic feature includes a third ferromagnetic layer; and
a conductive layer disposed between the first ferromagnetic layer and the third ferromagnetic layer.

16. The memory device of claim 11, wherein
the MTJ includes a first ferromagnetic layer and a second ferromagnetic layer separated by a thin dielectric spacer; and
the magnetic feature includes an anti-ferromagnetic layer adjacent the second ferromagnetic layer.

17. A memory device comprising:
a magnetic tunneling junction (MTJ), wherein the MTJ has an elliptical shape,
a magnetic feature aligned with the MTJ and approximate the MTJ, wherein the magnetic feature has a disk shape, wherein the MTJ includes a free magnetic layer and a fixed magnetic layer separated by a thin dielectric material layer; and
a conductive layer disposed between the magnetic feature and the MTJ, wherein the conductive layer is adjacent the free magnetic layer.

18. The memory device of claim 17, wherein the disk shape is circular.

19. The memory device of claim 17, wherein the disk shape of the magnetic feature disk defines a first dimension D1 in a first direction and a second dimension D2 in a second direction perpendicular to the first direction, wherein D1 is substantially equal to D2.

20. The memory device of claim 17, further comprising a pinning layer disposed over the fixed magnetic layer of the MTJ.

* * * * *